(12) United States Patent
Sakai et al.

(10) Patent No.: US 6,342,669 B1
(45) Date of Patent: Jan. 29, 2002

(54) SOLAR ELECTRIC POWER APPARATUS, SOLAR MODULE, AND INSTALLATION METHOD OF SOLAR MODULES

(75) Inventors: Soichi Sakai, Katano; Seiichi Kiyama, Takatsuki; Yukihiro Yoshimine, Hirakata, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/620,733

(22) Filed: Jul. 20, 2000

(30) Foreign Application Priority Data

Jul. 23, 1999 (JP) .......................................... 11-209421
Sep. 14, 1999 (JP) .......................................... 11-260851

(51) Int. Cl.$^7$ ............................................ H01L 31/042
(52) U.S. Cl. ...................... 136/244; 136/251; 136/258; 136/291; 438/66; 438/67; 52/173.3
(58) Field of Search ................................ 136/244, 251, 136/258 AM, 291; 438/66, 67; 52/173.3

(56) References Cited

U.S. PATENT DOCUMENTS 5,542,989 A * 8/1996 Ichikawa ..................... 136/251

FOREIGN PATENT DOCUMENTS

EP 0886324 A1 * 12/1998

* cited by examiner

*Primary Examiner*—Alan Diamond
(74) *Attorney, Agent, or Firm*—Darby & Darby

(57) ABSTRACT

In a solar electric power apparatus provided with a plurality of solar modules that are ranged in such a manner that edges of adjacent solar modules are overlapped, each solar module has a plurality of solar cells that are electrically connected in series with each other, with the serial connecting direction of the solar cells being set to a direction orthogonal to the ranging direction of the solar modules. Upon ranging these solar modules, one side portion of the solar module on the lower side on which a shadow of the solar module on the upper side is cast is formed into a non-power generation area by removing the solar cells therefrom.

28 Claims, 11 Drawing Sheets

SOLAR ELECTRIC POWER APPARATUS, SOLAR MODULE, AND INSTALLATION METHOD OF SOLAR MODULES

BACKGROUND OF THE INVENTION

The present invention relates to a solar electric power apparatus that is placed on a roof of a house, the top of a building or a wall, etc. and also concerns a solar module used therein and an installation method of solar modules.

The solar power-generation for converting light energy into electric energy by utilizing a photoelectric conversion characteristic been widely carried on as a means to obtain clean energy. Moreover, is the photoelectric conversion efficiency of a solar cell has been improved, solar electric power apparatuses have come to be installed in many private houses.

FIG. 1 is a cross-sectional view that shows a state in which a plurality of solar modules are placed on a roof of a private house so as to constitute such a solar electric power apparatus. In FIG. 1, reference number 1 represents a solar module, and each solar module 1 has a plurality of solar cells that have, photoelectric conversion function aid that are connected in series with each other.

These plurality of solar modules 1 are ranged on a roof 100 in a stepped manner from the ridge side to the eaves side with the edges of the adjacent solar modules 1 overlapped on each other. Such a stepped formation of the solar modules 1 refers to a stepped single-lap roofing.

In the case when a plurality of solar modules 1 are placed in a stepped manner, depending on the orientation of the installation, especially in the morning or evening when the sunlight has a low altitude, when the sunlight (arrow in FIG. 1) is directed from the ridge side, the solar module 1 placed on the upper side (ridge side) forms a shadow (hatched portion in FIG. 1) on the upper side of the solar module 1 placed on the lower side (eaves side), As a result, in the solar module 1 on the lower side (eaves side), the area covered with the shadow S does not allow the solar cell to generate power, thereby forming a great resistance and causing a reduction in the output. Moreover, since the solar cell forms a great resistance, heat is generated, and as the temperature rises, drawbacks such as gas generation from the back surface material, degradation in the solar cell or separation of the film, occur, resulting in a reduction in the output.

With respect to materials constituting a solar cell, a crystalline semiconductor such as single crystal silicon or polycrystal silicon, an amorphous semiconductor such as amorphous silicon or amorphous silicon germanium, or a compound semiconductor such as GaAs or CdTe is used. Among these, the solar cell using the amorphous semiconductor has a high degree of freedom in selecting the substrate and in designing the output system and is inexpensive in manufacturing costs; therefore, much attention has been focused on such a solar cell. However, in an arrangement in which a solar battery of an integrated construction having a plurality of sole; cell, being connected in series with each other on one common substrate is applied to the solar electric power apparatus, sufficient researches have not been made on the adverse effects of a shadow formed by the solar module placed on the upper side (ridge side) given to the characteristics of the solar electric power apparatus.

BRIEF SUMMARY OF THE INVENTION

In a solar electric power apparatus which a plurality of solar modules are ranged, an object of in present invention is to provide a solar electric power apparatus that exerts superior output characteristics in particular, when a solar battery of an integrated construction is used.

Another object of the present invention is to provide a solar module that is free from adverse effects of a shadow formed by the solar module placed on the upper side when a plurality of solar modules are ranged and consequently makes it possible to prevent a reduction in the output, and also to provide an installation method for these solar modules.

In the solar electric power apparatus in the present invention provided with a plurality of solar modules that are ranged in such a manner that edges of adjacent solar modules are overlapped, each solar module is provided with a plurality of solar cells that are electrically connected in series with each other, and the serial connecting direction of the solar cells is set to a direction orthogonal to the ranging direction of the solar modules.

In the case when a plurality of solar modules are ranged in a stepped manner, for example, the solar module located on the lower side is subject to adverse effects given by a shadow of the solar module located on the upper side. In the case of the application of a solar battery of the integrated construction, when the solar modules are ranged with the serial connecting direction of the solar cells being coincident with a direction parallel to the ranging direction (eave-ridge direction), those solar cells covered with a shadow and those solar cells not covered with a shadow are located in a mixed manner in the solar module on the lower side, with the result that a reverse bias voltage is applied to those solar cells covered with the shadow and having a reduced output causing a possibility of cell damage. In contrast, in the present invention, since the solar modules are ranged with the serial connecting direction of the solar cells being set to a direction (a lateral direction) orthogonal to the ranging direction, each of the solar cells of the solar module located on the lower side is covered with a shadow in the same degree to that no problems are raised even upon generation of a shadow, thereby providing superior output characteristics.

Moreover, in the solar module of the present invention, an area in which no power is generated (non-power generation area) is installed in one side portion thereof, and these solar-modules are ranged in a stepped manner with the non-power generation area being located on the upper side (ridge side). In this installation state of the solar modules, when sunlight is directed from the ridge side, the shadow of the solar module on the upper side is formed on the non-power generation area of the solar module on the lower side; therefore, even when the solar modules are ranged with the serial connecting direction of the solar cells being coincident with a direction parallel to the ranging direction (eave-ridge direction), the portion in question does not form a great resistance, which makes it different from the conventional arrangement; thus, it is possible to prevent a reduction in the output of the solar modules, and consequently to obtain a stable photoelectric power.

When such a non-power generation area is installed, the amount of power generation tends to decrease. Therefore, it is preferable to correctly place the non-power generation area only at a portion covered with a shadow. In this invention, the length of the non-power generation area is set to not less than 10 mm and not more than six times the thickness of the solar module, or set to not less than 10 mm and not more than three times the thickness of the solar module in the case when the thickness of the solar module is not less than 20 mm. With this arrangement, it is possible to completely prevent adverse effects given by a shadow without causing a reduction in the amount of annual power generation. Moreover, this non-power generation area is easily formed by removing the solar cells at the corresponding portion.

Additionally, upon ringing a plurality of solar modules in a stepped manner, an interposition object made from a material that causes no adverse effects on solar electric power generation may be interpolated between the adjacent solar modules; thus, it is also possible to prevent adverse effects given by a shadow of the solar module on the upper side. In this case, the length of the interposition object is set in the same manner is the above-mentioned non-power generation area.

The above and further objects and features of the invention will more fully be apparent from the following detailed description with accompanying drawings.

FIG; 10 is an explanatory drawing that shows calculations of the length of a shadow.

Figure 11:
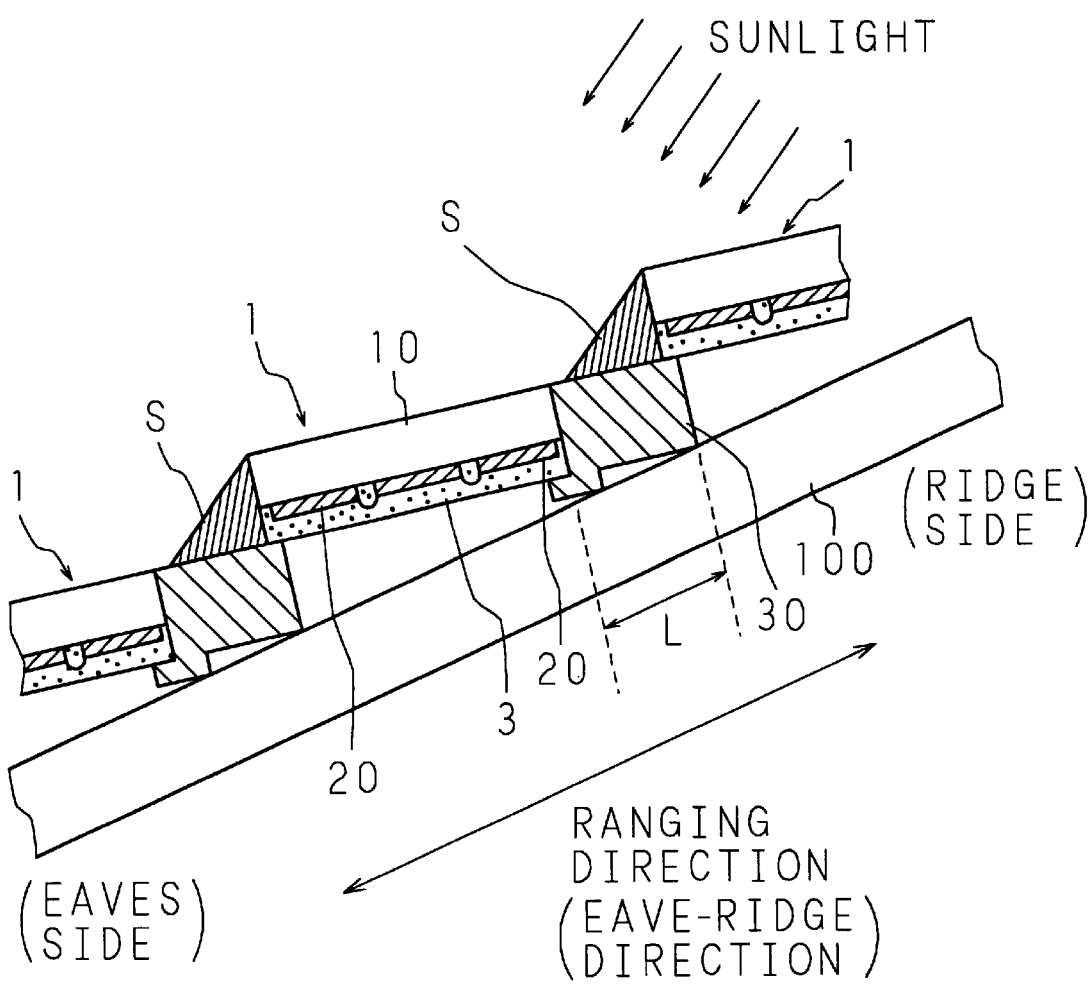

FIG. 11 is a cross-sectional view that shows another ranging state of the solar modules of the present invention.

DETAILED DESCRIPTION OF THE INVENTION

Figure 1:
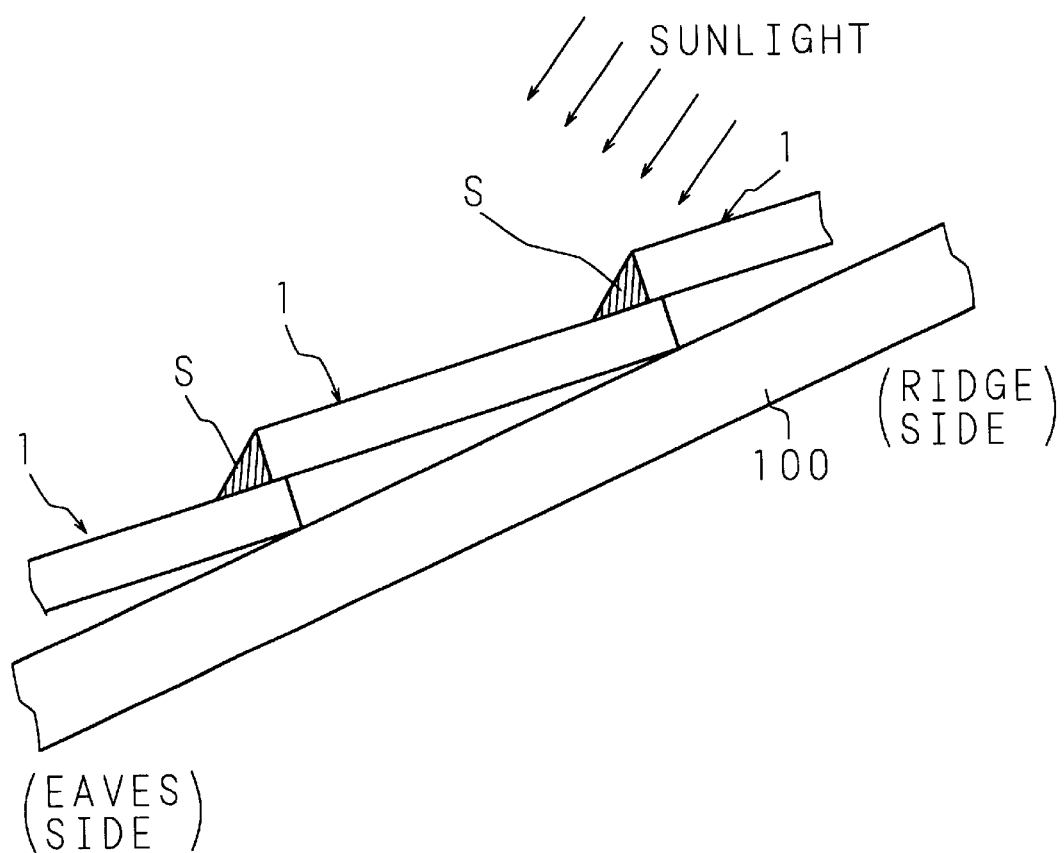
FIG. 1 is a cross-sectional view that shows one portion solar electric power apparatus that is constituted by a plurality of solar modules placed on a roof in a stepped manner.
Figure 2:
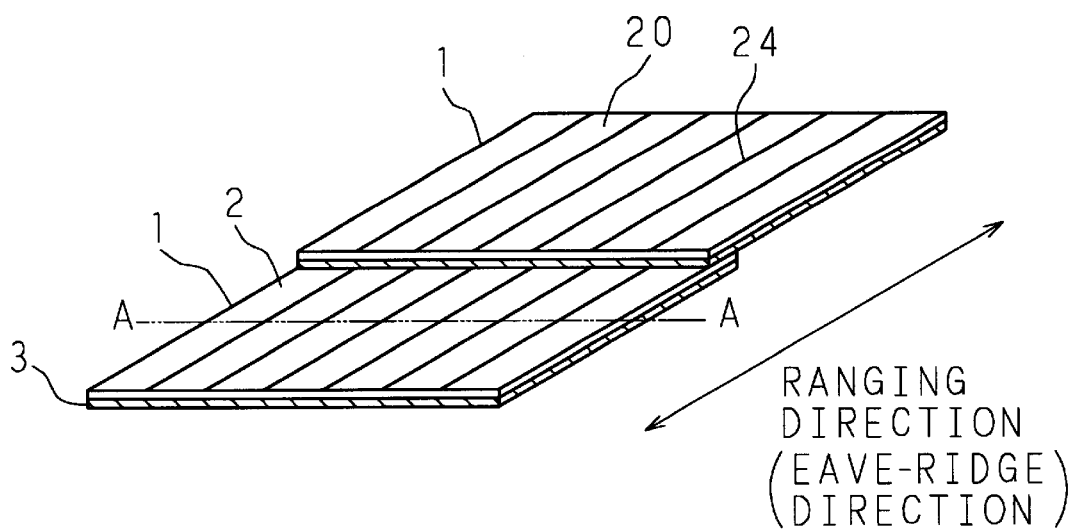
FIG. 2 is a perspective view that conceptually shows the solar electric power apparatus of the present invention.
Figure 3:
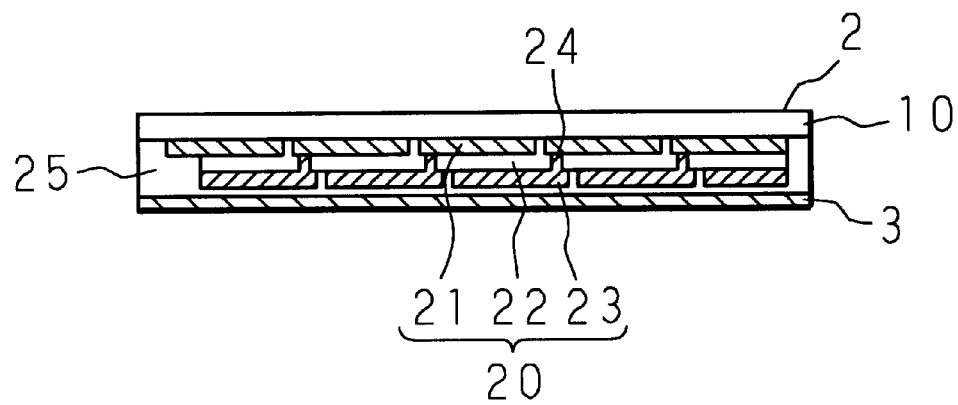
FIG. 3 is a cross-sectional view taken along line A—A of FIG. 2.

Referring to Figures, the following description will discuss embodiments of the present invention.
First Embodiment FIG. 2 is a perspective view that conceptually shows a solar electric power apparatus of the present invention, and FIG. 3 is a cross-sectional view taken along line A—A of FIG. 2. The solar electric power apparatus is constituted by ranging a plurality solar modules 1 in, an eave-ridge direction of a roof, in a stepped manner. The solar module 1 has a solar portion 2, and a back surface material 3 that is bonded to the back surface side of the solar portion 2. Any known materials, such as a glass plate, an aluminum plate, or a steel plate, may be used as the back surface material 3.

As illustrated in FIG. 3, the solar portion 2 comprises a transparent substrate 10 made of glass, and a plurality of solar cells 20 that are electrically connected in series with each other, and placed on the back surface of the transparent substrate 10. This solar cell 20 includes a first electrode 21 made of a transparent conductive material, such as $SnO_2$ ITO or ZnO, a photoelectric conversion layer 22 made of an amorphous semiconductor with a pin junction, and a second electrode 23 made of a highly reflective metal such as Ag or Al, all of which are slacked in succession, for example, from the transparent substrate 10 side. A serial connection portion 24, formed by removing the photoelectric conversion layer 22, is provided in one portion of the surface of the first electrode 21. Here, with respect to the adjacent solar cell 20, the second electrode 23 of one of the solar cells 20 is embedded into the serial connection portion 24 of the other solar cell 20 so as to contact the first electrode 21; thus, the two cells are electrically connected in series with each other.

Moreover, the surface of thy solar cells 20 electrically series-connected in this manner is coated with a protective layer 25 made of, for example, epoxy resin, and the back surface material 3 is bonded thereto with a bonding layer such as an EVA sheet, not shown.

In the first embodiment, illustrated in FIG. 2, the serial connecting direction of the solar cells 20 is set to a direction (lateral direction in FIG. 2) orthogonal to the ranging direction (the eave-ridge direction of the roof) in which the solar modules 1 are ranged in a stepped manner.

Next, referring to FIGS. 4 to 7, an explanation will be given of the effects of the first embodiment having the above-mentioned construction.

Figure 4:
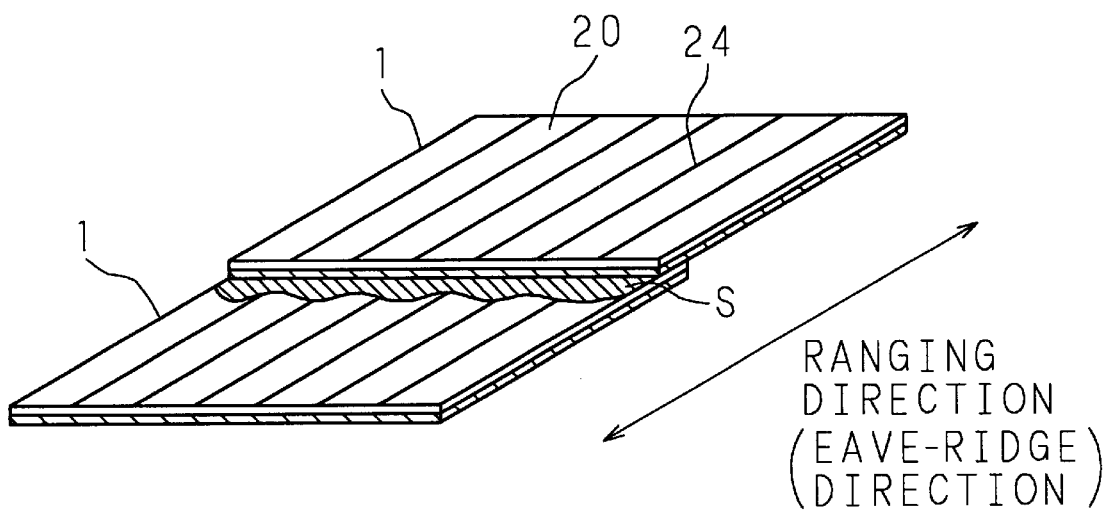
FIG. 4 is a perspective view that conceptually shows a state which a shadow is formed on the solar electric power apparatus of the present invention.
Figure 5:
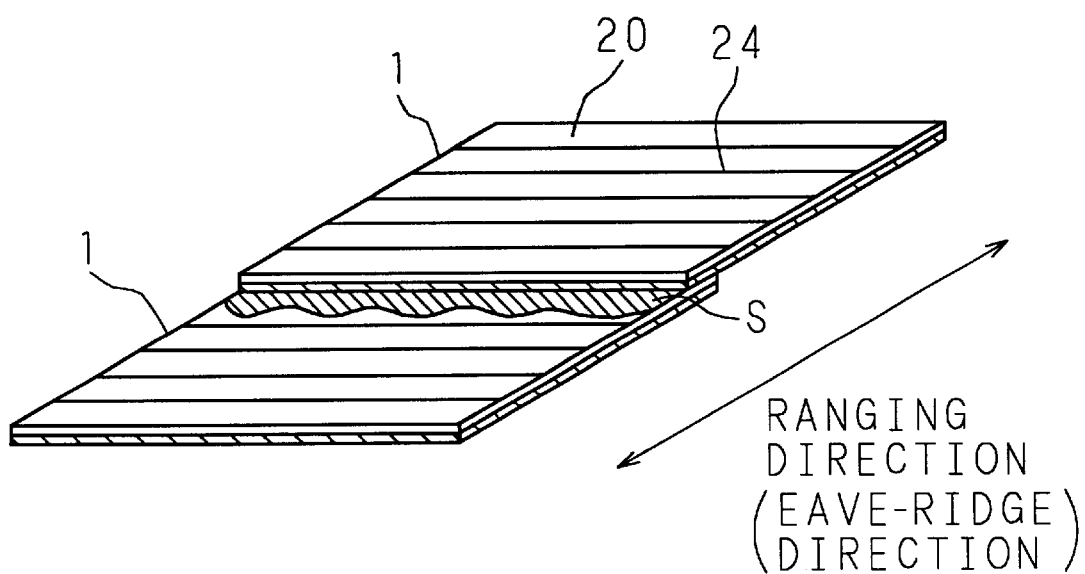
FIG. 5 is a perspective view that conceptually shows a state in which a shadow is formed on a solar electric power apparatus of a comparative example.

FIG. 4 is a perspective view that conceptually shows a state in which a shadow S is formed on the solar electric power apparatus of the first embodiment, and FIG. 5 is a perspective view that conceptually shows a state in which a shadow S is formed on a solar electric power apparatus of a comparative example. In the solar electric power apparatus of the comparative example shown in FIG. 5, the serial connecting direction of the solar cells 20 is set to a direction parallel to the ranging direction in which the solar modules 1 are ranged in a stepped manner.

As described earlier, in the solar electric power apparatus in which the solar modules 1 are ranged in a stepped manner in the ranging direction (eave-ridge direction), a shadow S of the solar module 1 on the upper side is formed on one portion of the solar module 1 on the lower side. In this case, in any of the solar modules 1 of the solar electric power apparatuses shown in FIGS. 4 and 5, the shadow S is formed on the upper side. In the case of the solar electric power apparatus of the first embodiment, as shown in FIG. 4. the upper side of each solar cell 20 is covered with the shadow S to virtually the same degree. Therefore, a plurality of solar cells 20 that have a reduction in the output to the same degree are electrically connected in series with each other. In this manner, in the solar electric power apparatus of the first embodiment, even when a shadow S is formed, the solar cells 20 having virtually the same output are series-connected; therefore, no problems arise.

In contrast, in the solar electric power apparatus of the comparative example, a s illustrated in FIG. 5, the solar cell 20 on the uppermost side is virtually completely covered with a shadow S, with the result that hardly any current is generated in this solar cell 20. In contrast, the solar cells 20 on the lower side are free from the shadow S, with the result that there is no reduction in the outputs. Therefore, in the solar electric power apparatus of the comparative example, the solar cells 20, each of which generates an output that is the same output as designed, are series-connected to the solar cell 20 that generates hardly any current, raising a problem in which no output is obtained as the module. Moreover, since a reverse bias voltage is applied from other solar cells 20 to the solar cell 20 covered with the shadow S, there is a possibility that the solar cell 20 in question might be damaged.

Figure 6A:
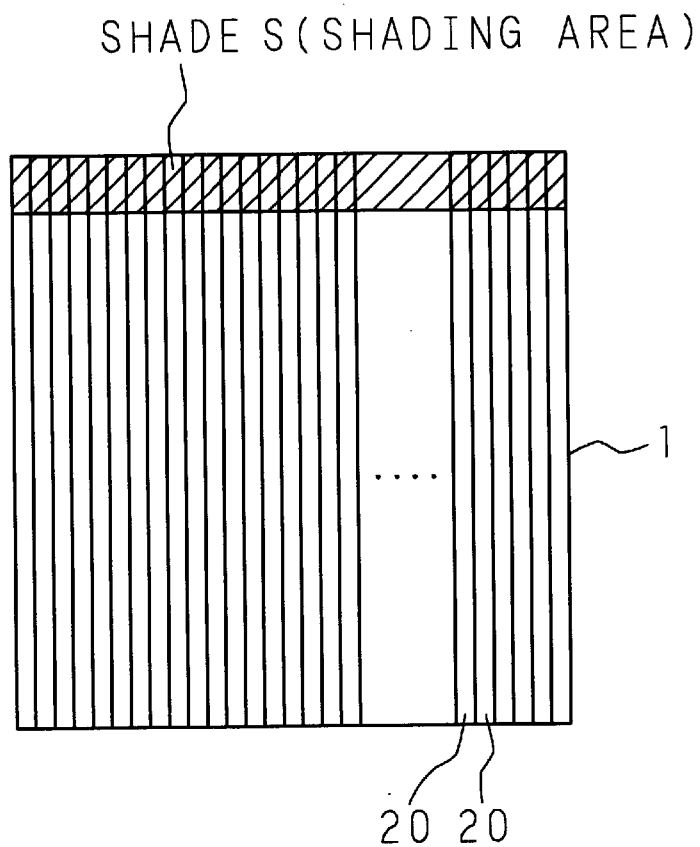
FIG. 6A is an explanatory drawing that shows a shading area of a solar module that is used for measuring characteristics of the solar electric power apparatus of the present invention.
Figure 7A:
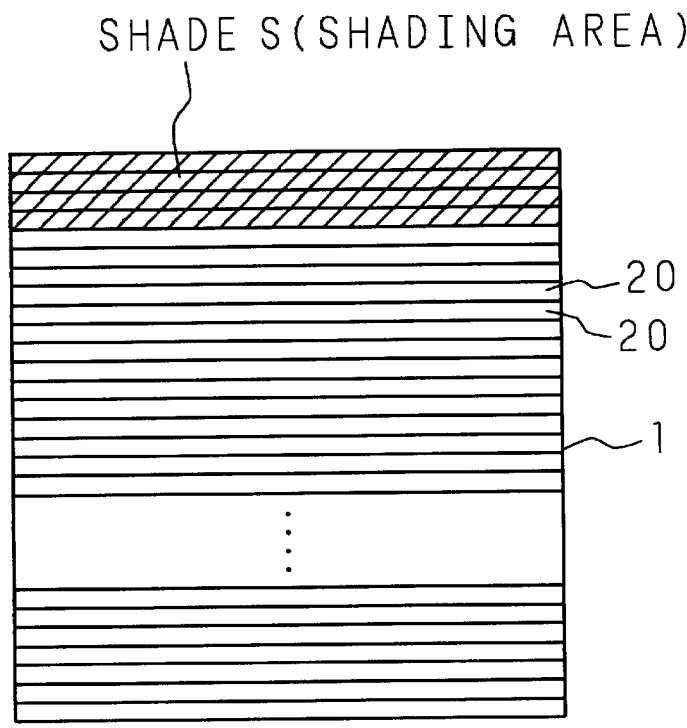
FIG. 7A is an explanatory drawing that shows a shading area of a solar module that is used for measuring characteristics of the solar electric power apparatus of the comparative example.

Here, an explanation will be given of the actual measured values of the output characteristics of the first embodiment and the comparative example that are influenced by a shadow S. FIG. 6A shows a sheet of a solar module 1 in the solar electric power apparatus of the first embodiment, in which 40 solar cells 20 are connected in a direction orthogonal to the ranging direction, FIG. 7A shows a sheet of a solar module 1 in the solar electric power apparatus of the comparative example, in which 40 solar cells 20 are connected in a direction parallel to the ranging direction. Supposing that a shadow S is formed on an area covering 10% of the surface of the solar module 1, in the case of the example (first embodiment) of FIG. 6A, 10% of each of the forty solar cells 20 is shielded from light, and in the case of the example (comparative example) of FIG. 7A, four solar cells that account for 10% of the forty solar cells 20 are completely shielded from light.

Figure 6B:
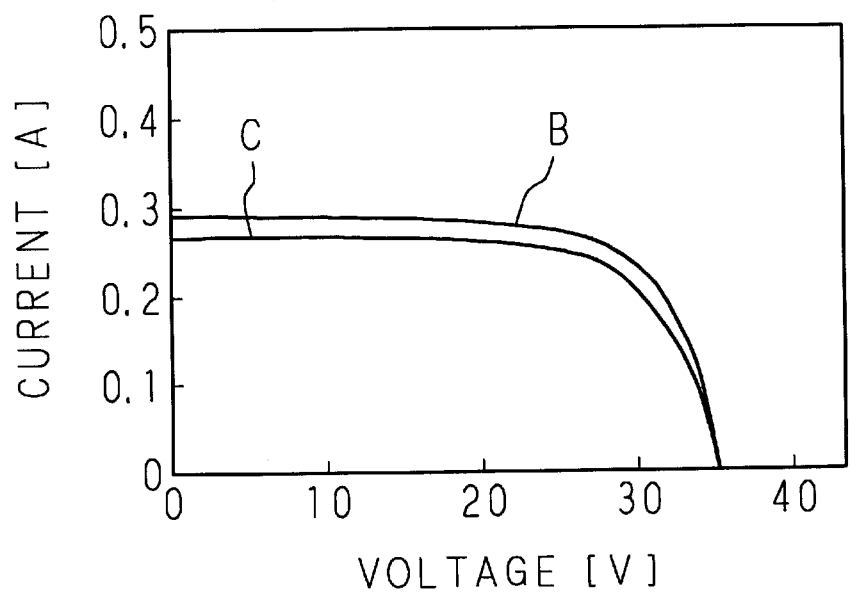
FIG. 6B is a graph that shows the results of measurements on the characteristics of the solar electric power apparatus of the present invention.
Figure 7B:
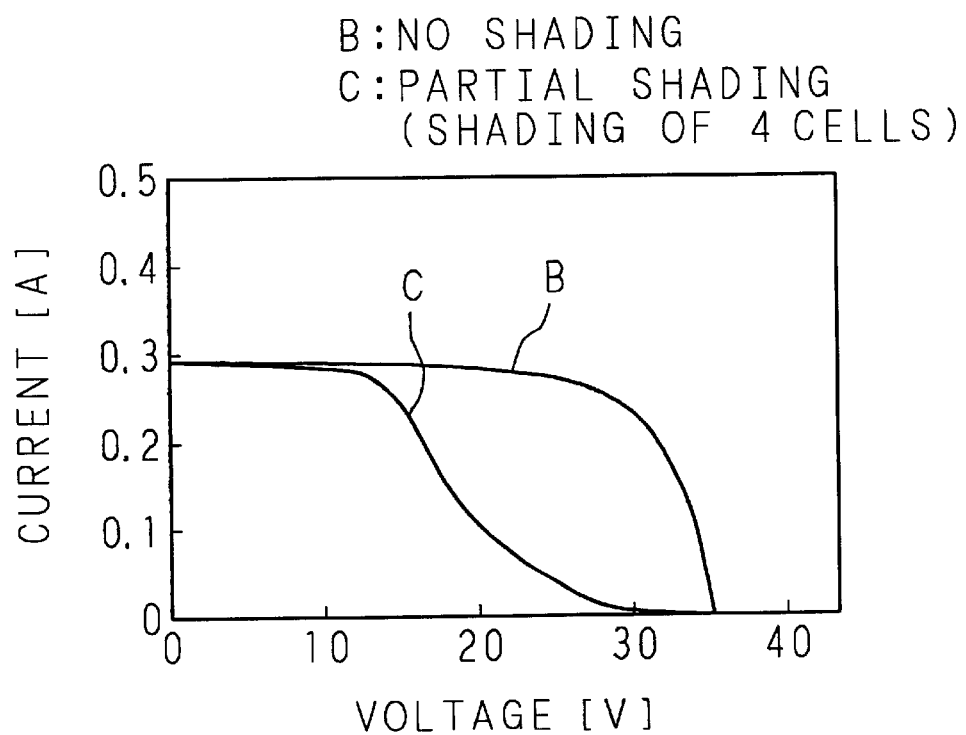
FIG. 7B is a graph that shows the results of measurements on the characteristics of the solar electric power apparatus of the comparative example.

FIG. 6B and FIG. 7B are graphs Sat show output characteristics (the relationship between the output voltage (V) and the output current (A) of the solar modules 1 shown in FIG. 6A, and FIG. 7A. In FIG. 6B and FIG. 7B, solid line B represents an output characteristic with no shadow S being formed, and solid line C represents an output characteristic with a shadow S being formed, In the case when a shadow S is formed under the same conditions, in the first embodiment FIG. 6B), the output (electric power) has only a reduction of approximately 10% while in the comparative example (FIG. 7B), the output (electric power) has a reduction as much as, approximately 50%.

As described above, in the first embodiment, the solar electric power apparatus is provided with a plurality of solar modules 1 that are ranged in a stepped manner, each solar module 1 having a plurality of solar cells 20 that are constituted by amorphous semiconductors, and electrically connected in series with each other, and the serial connecting direction of the solar cells 20 is set to a direction orthogonal to the ranging direction of the solar modules 1; therefore, even when a shadow S of the solar module 1 on the upper side is formed on the solar module 1 on the lower side, no problems arise, thereby making it possible to provide a solar electric power apparatus having superior output characteristics.

Second Embodiment

Figure 8:
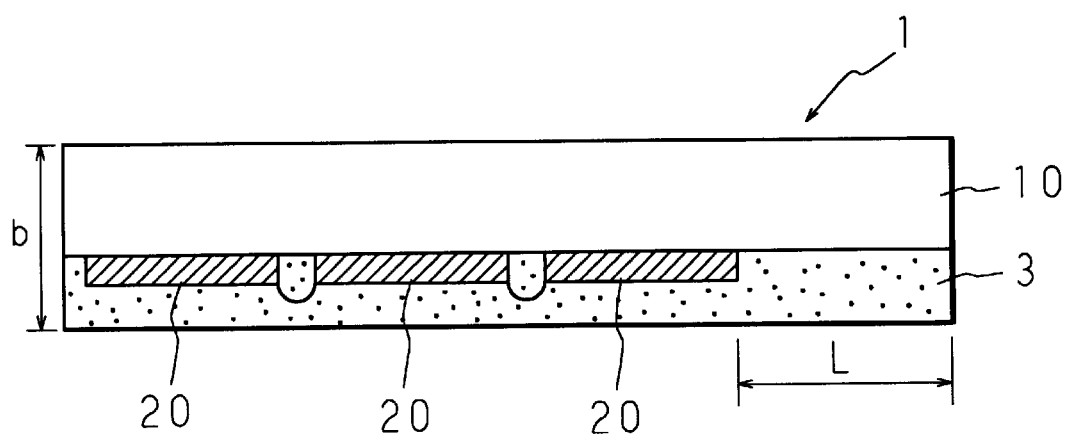
FIG. 8 is a cross-sectional view that shows a construction of the solar module of the present invention.

FIG. 8 is a cross-sectional view showing the structure of a solar module 1 in accordance with the second embodiment. The solar module 1 (thickness: b (mm)) comprises a transparent substrate 10 made of, for example, glass, a plurality of solar cells 20 having a photoelectric conversion function, connected in series with each other, and a back surface material made of for example, a resin film, which are laminated with each other; and on its one side portion, no solar cells 20 are installed over a length L(mm) from the end face, that is, a laminated structure, constituted only by the transparent substrate 10 and the back surface material 3, is formed, thereby providing an area where no power is generated (non-power generation area).

Figure 9:
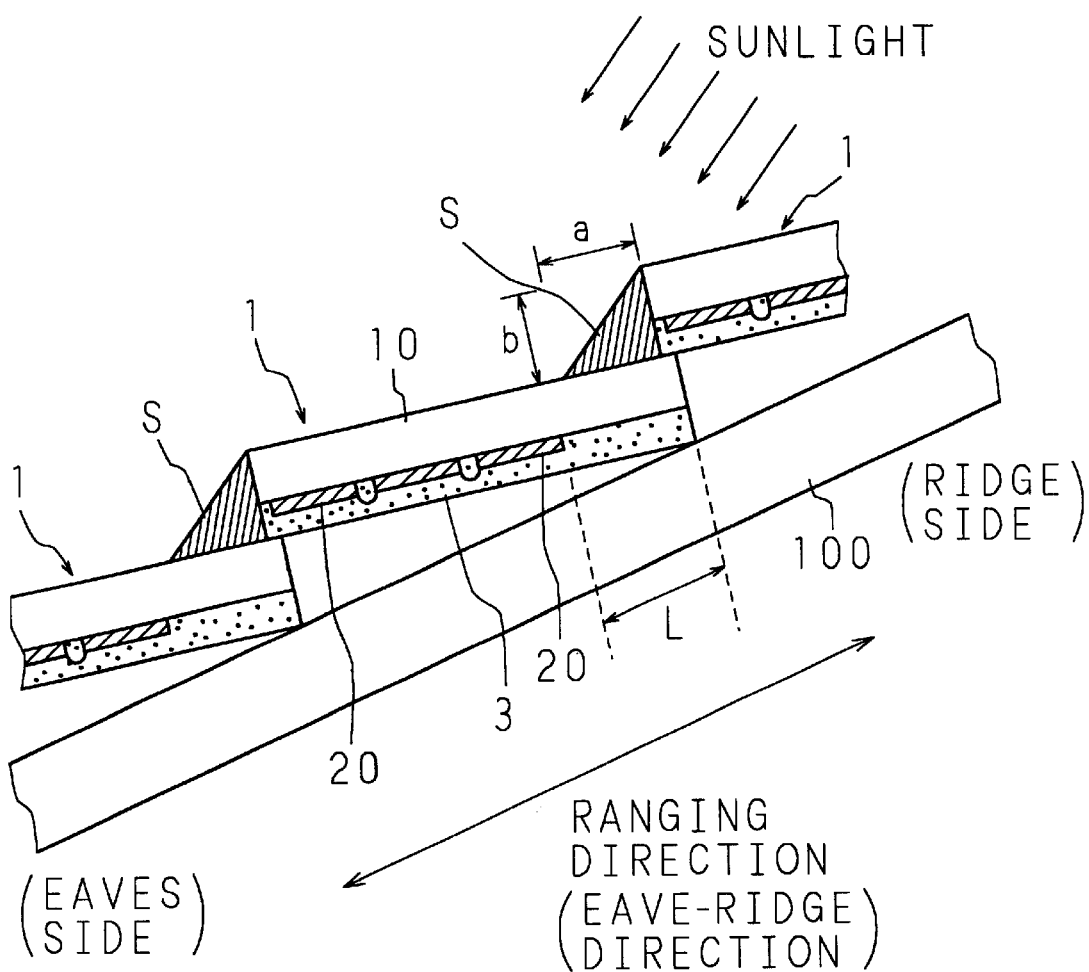
FIG. 9 is a cross-sectional view that shows an ranging state of the solar modules of the present invention.

FIG. 9 is a cross-sectional view that shows a state in which these solar modules 1 are ranged on a roof 100 in a stepped manner in the eave-ridge direction (the ranging direction). Each of these solar modules 1 is installed in a manner so as to place its non-power generation area on the upper side (ridge side), and the adjacent solar modules 1 are arranged on the roof 100 in a stepped manner from the ridge side toward the eaves side with a step difference of b, with the edges thereof being overlapped on each other. Here, the serial connecting direction of the solar cells 20 is set to a direction parallel to the ranging direction (ridge-eave direction) in which the solar modules 1 are ranged in a stepped manner.

In the case when these solar modules 1 are placed in this manner, upon irradiation with sunlight (arrow in FIG. 9) from the ridge side, a shadow S (a hatched portion in FIG. 9, length: a (mm)) of the solar module 1 on the upper side is formed on the solar module 1 on the lower side. In the second embodiments along one side portion of each solar module 1, that is, one side portion located on another solar module 1 on the upper side in the stepped arrangement, is formed a non-power generation area having a length of L, and the shadow S is formed on the portion corresponding to this non-power generation area. Therefore, different from the conventional arrangement, no adverse effects are given by the shadow S so that the portion bearing the shadow S does not form a great resistance thus, it is possible to prevent a reduction in the output of the solar module 1, and consequently to provide a stable photoelectric power.

Next, the following description will discuss the setting optimum value of the length L with respect to the non-power generation area of the solar module 1. In the case when the non-power generation area is formed in the solar module 1, it is feared that the amount of power generation might decrease. For this reason, the non-power generation area is preferably placed only within an area in which the shadow S is positively formed, and the optimum value of the length L is set so as to allow the amount of annual power generation obtained by the solar module 1 of the second embodiment to exceed the amount of annual power generation obtained by a conventional solar module 1. This optimum value in related to the installation conditions of the solar module 1, the altitude of the sun, etc.

The length a of the shadow S formed upon application of sunlight from the ridge side depends on the angle and orientation at the time when the solar modules 1 are installed, the altitude of the sun, the orientation of the sun, etc. In areas of middle latitudes in the northern hemisphere, it is generally arranged that the solar modules 1 are placed with a tilt angle in a range of approximately 20 to 30° (installation angle) on the east side, south side, west side, or a side in between on a roof. Therefore, in actual service, under the condition of a sun latitude in the range of 30 to 40° where the intensity of sunlight is strong and the sun latitude exceeds the tilt angle (installation angle) of the solar modules 1, provision is made so as to prevent the shadow S from giving adverse effects to the solar modules 1.

Figure 10:
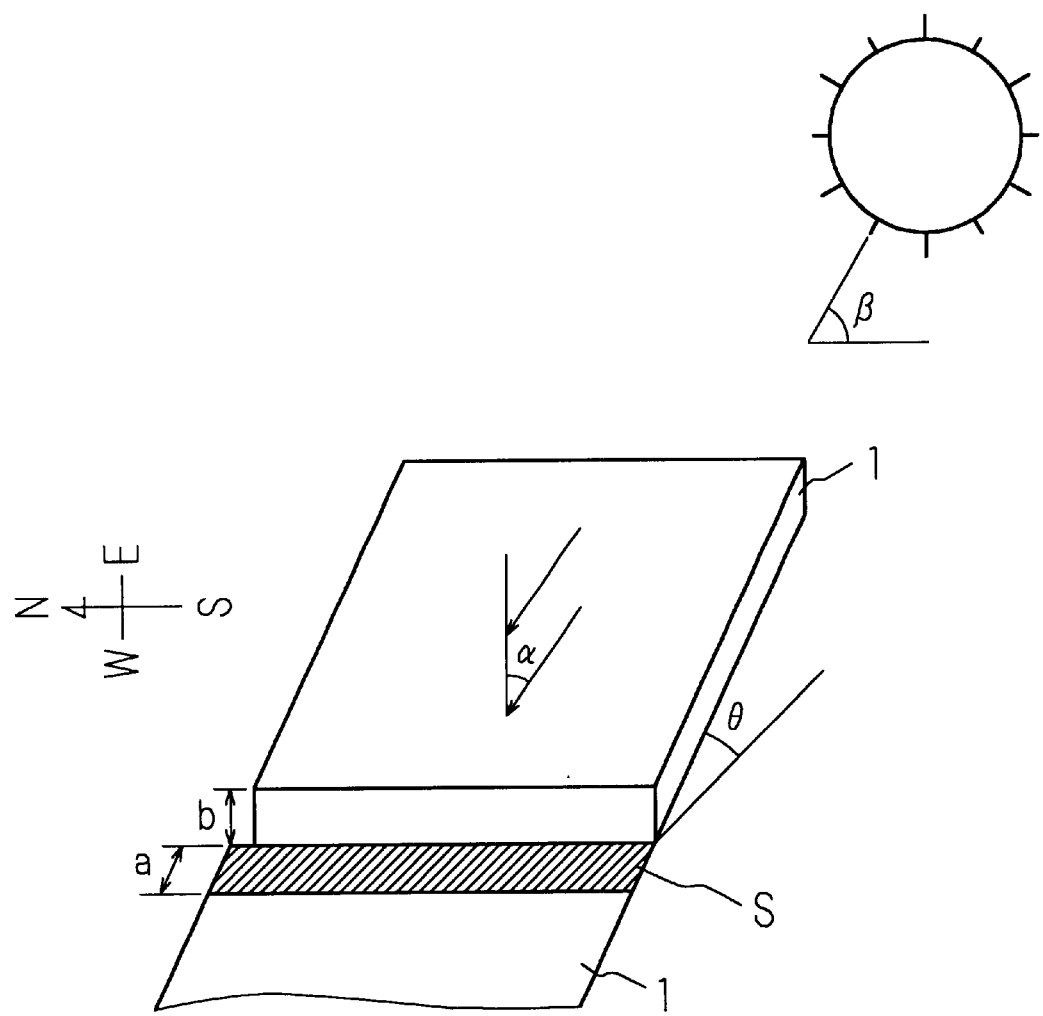

For example, as illustrated a he FIG. 10, the solar modules 1 were placed with a tilt angle (installation angle) $\phi \div 20°$, and in both of the cases when the sun has a latitude of $\beta=30°$ with an orientation $\alpha$ in the right east, which assumes 7 a.m. in May, and when the sun has a latitude of $\beta=30°$ with orientation $\alpha$ in a position 80° south from the right east, which assumes 11 a.m. in January, the length a of the shadow S is calculated by using a step difference b, thereby obtaining the following equations (1) and (2).

$$\text{(May) } \bar{a}=\cos 0°\times 1/\tan(30°-20°)\times b=5.7b \quad (1)$$

$$\text{(January) } a=\cos 80°\times 1/\tan(30°-20°)\times b=0.98b \quad (2)$$

As described above, in the case of the altitude of the sun of 30°, the length a of the shadow S is maintained 0.98 to 5.7 times the step difference b (the thickness of the solar module 1) all through the year. Moreover, when the same calculations are made by using the altitude of the sun of 40°, the length a of the shadow S is maintained 0.48 to 2.7 times the step difference b (the thickness of the solar module 1).

From the facts described above, in the case of the altitude of the sun in the range of 30 to 40°, it is found that the length a of the shadow S is maintained in the range of approximately 0.5 to 6 times the step difference b (the thickness of the solar module 1). Therefore, the length L of the non-power generation area that is formed in one side portion of the solar module 1 is preferably set in the range from 0.5 to 6 times the step difference b (the thickness of the solar module 1) so as to be coincident with the length a of the shadow S that is formed thereon. Here, in general, in the solar module 1, taking reliability into consideration, the solar cells 20 are placed approximately 10 mm apart from the side edge. Therefore. the above-mentioned length L is preferably set in the range from not less than 10 mm to not more than 6b (mm).

Moreover, upon placing a plurality of solar modules 1 in a stepped manner, it is preferable to set the step difference b (the thickness of the solar module 1) to not less than 20 mm from the designing point of view. in the case when the step difference b (the thickness of the solar module 1) is 20 mm, supposing that the upper limit of the length L is 6 times the value b, the upper limit value becomes 120 mm, thereby reducing the power generating area to a great degree. For this reason, taking it into consideration the influences of the shadow S at the time of the sun latitude of not less than 40° where the a mount of solar radiation is great, it is preferable to sit the upper limit of the length L to three times the step difference b (the thickness of the solar module 1). Furthermore, also taking it into consideration that au solar cell 20 is placed within approximately 10 mm inside from the side edge from the viewpoint of reliability, the length L is preferably set in the range from not less than 10 mm to not more than 3b (mm).

As described above, in the solar module 1 of the second embodiment. the non-power generation area is provided in one side portion located on the upper solar module 1 side when placed in a stepped manner; therefore, different from the conventional arrangement, no adverse effects are given from the shadow S; therefore, it is possible to prevent a reduction in the output of the solar module 1, and consequently to obtain a stable photoelectric power.

Here, the length of the non-power generation area is set to not more than six times the thickness of the solar module 1, or, in the case of the thickness of the solar module 1 of not less than 20 mm, it is set to not more than three times the thickness; therefore, it is possible to completely prevent adverse effects of the shadow S without causing a great reduction in the amount of power generation.

Third Embodiment

FIG. 11 is a cross-sectional view that shows a stepped installation state of a plurality of solar modules 1 in accordance with the third embodiment. In FIG. 11, the same members as FIG. 9 are indicated by therefore reference numbers, and the description thereof is omitted. In the third embodiment, normal solar modules 1 without the non-power generation area are ranged in a stepped manner from the ridge side to the saves side on a roof 100, with an interposition object 30 having a length of L, made of glass, resin, etc., being interpolated between the adjacent solar modules 1. Here, in the same manner as the second embodiment, the serial connecting direction of the solar cells 20 is set to a direction parallel to the ranging direction (eave-ridge direction).

In the third embodiment, upon irradiation with sunlight from the ridge side (arrow in FIG. 11), a shadow S (a hatched portion in FIG. 11) of the solar module 1 on the upper side is formed on the interposition object 30; therefore, in the same manner as the second embodiment, no adverse effects are given from the shadow S; therefore, it is possible to prevent a reduction in the output of the solar module 1, and consequently to obtain a stable photoelectric power.

Here, the length L of the interposition object 30 can be set in the same manner as the length L of the non-power generation area in the second embodiment.

As described above, in the third embodiment, solar modules a are placed in a stepped manner with the interposition object 30 that is not related to power generation being interpolated between the adjacent solar modules 1; therefore, different from the conventional arrangement, no adverse effects are given from the shadow S; thus, it is possible to prevent a reduction in the output of the solar module 1, and consequently to obtain a stable photoelectric power.

In order to prevent adverse effects of a shadow, the second and third embodiments become more effective when a solar battery of an integrated type is used and when the solar modules 1 are ranged with the serial connecting direction of a plurality of solar cells 20 being set to a direction parallel to the ranging direction (ridge-eave direction).

Here, in the above-mentioned example, an explanation has been given of a case where a plurality of solar modules are ranged on a roof; however, the present invention is not intended to be limited thereby, and the present invention may be applied to a case where they are attached to, for example, a side face of a building, etc. Thus, the present invention may be applied to any solar electric power apparatus having solar modules ranged in such a manner that edges of adjacent solar modules are overlapped.

Moreover, in the above-mentioned examples, explanations have been given of a case in which amorphous semiconductors are used in constituting solar cells; however, the present invention may be applied to solar cells constituted by other semiconductor materials such as compound semiconductors, as long as they form a solar battery of an integrated type.

As this invention may be embodied in several forms without departing from the spirit of essential characteristics thereof, the present embodiment is therefore illustrative ark not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A solar electric power apparatus, comprising:
   a plurality of solar modules that are ranged in such a manner that edges of adjacent solar modules are overlapped,
   wherein a solar module comprises a plurality of solar cells that are electrically connected in series with each other, with the serial connecting direction of said plurality of solar cells being set to a direction orthogonal to the ranging direction of said plurality of solar modules, so that a first solar module which overlaps a second solar module from above casts a shadow which is formed substantially equally on each of the solar cells of the second module.

2. The solar electric power apparatus according to claim 1, wherein said plurality of solar cells are series-connected on a common substrate.

3. The solar electric power apparatus according to claim 1, wherein one solar cell includes an amorphous semiconductor.

4. The solar electric power apparatus according to claim 1, wherein the ranging direction is an eave-ridge direction of a roof.

5. A solar electric power apparatus, comprising:
- a plurality of solar modules that are ranged in such a manner that edges of adjacent solar modules are overlapped,
- wherein one solar module comprises a plurality of solar cells that are electrically connected in series with each other in a direction parallel to the ranging direction of said plurality of solar modules, said one solar module being provided with a non-power generation area on one side portion thereof in the range direction, the non-power generation area being located so that a shadow is cast thereon by a solar module overlapping said one solar module from above.

6. The solar electric power apparatus according to claim 5, wherein said plurality of solar cells are series-connected on a common substrate.

7. The solar electric power apparatus according to claim 5, wherein said non-power generation area has a length of not less than 10 mm and not more than 6 times a thickness of said one solar module.

8. The solar electric powder apparatus according to claim 5, wherein, when said one solar module has a thickness of not less than 20 mm, said non-power generation area has a length of not less than 10 mm and not more than three times a thickness of said one solar module.

9. The solar electric power apparatus according to claim 5, wherein said non-power generation area is formed by removing solar cells.

10. The solar electric power apparatus according to claim 5, wherein said non-power generation area is formed by an interposition object that is not related to power generation.

11. The solar electric power apparatus according to claim 5, wherein the ranging direction is an eave-ridge direction of a roof.

12. A solar module, a plurality of which are to be ranged in such a manner that edges of adjacent solar modules are overlapped so as to constitute a solar electric power apparatus, comprising:
- a plurality of solar cells that are series-connected in a direction orthogonal to the ranging direction of the solar modules, so that a first solar module which overlaps a second solar module from above casts a shadow which is formed substantially equally on each of the solar cells of the second module.

13. The solar module according to claim 12, wherein said plurality of solar cells are series-connected on a common substrate.

14. The solar module according to claim 12, wherein one solar cell includes an amorphous semiconductor.

15. The solar module according to claim 12, wherein the ranging direction is an eave-ridge direction of roof.

16. A solar module, a plurality of which are to be ranged in such a manner on that edges of adjacent solar modules are overlapped so as to constitute a solar electric power apparatus, comprising:
- a plurality of solar cells that are series-connected in a direction parallel to the ranging direction of the solar modules; and
- a non-power generation area formed on one side portion thereof in the ranging direction, the non-power generation area being so located that a shadow cast on said solar module by a second solar module overlapping it from above will be cast in the non-power generation area.

17. The solar module according to claim 16, wherein said plurality of solar cells are series-connected on a common substrate.

18. The solar module according to claim 16, wherein said non-power generation area has a length of not less than 10 mm and not more than 6 times a thickness of said solar module.

19. The solar module according to claim 16, wherein when said solar module has a thickness of not less than 20 mm, said non-power generation area has a length of not less than 10 mm and not more than three times the thickness of said solar module.

20. The solar module according to claim 16, wherein said non-power generation area is formed by removing the solar cells.

21. The solar module according to claim 16, wherein one solar cell includes an amorphous semiconductor.

22. The solar module according to claim 16, wherein the ranging direction is an eave-ridge direction of a roof.

23. An installation method of solar modules, comprising the steps of:
- preparing a plurality of solar modules, each of which has a plurality of solar cells that are series-connected on a common substrate; and
- ranging said plurality of solar modules in a direction orthogonal to the serial connecting direction of said plurality of solar cells, so that a first solar module which overlaps a second solar module from above casts a shadow which is formed substantially equally on each of the solar cells of the second module.

24. The installation method of solar modules according to claim 23, wherein the ranging direction of said plurality of solar modules is an eave-ridge direction of a roof.

25. An installation method of solar modules, comprising the steps of:
- preparing a plurality of solar modules, each of which has a non-power generation area on a side portion thereof and a plurality of solar cells that are series-connected on a common substrate; and
- ranging said plurality of solar modules, so that a shadow of a first solar module overlapping a second solar module from above is cast in the non-power generation area of the second solar module.

26. The installation method of solar modules according to claim 25, wherein the ranging direction of said plurality of solar modules is an eave-ridge direction of a roof.

27. An installation method of solar modules, comprising the steps of:
- preparing a plurality of solar modules, each of which has a plurality of solar cells that are series-connected on a common substrate; and
- ranging said plurality of solar modules with an interpolation object not related to power generation being interpolated between adjacent solar modules, so that a shadow cast by a first solar module on a second solar module falls on the interpolation object therebetween.

28. The installation method of solar modules according to claim 27, wherein the ranging direction of said plurality of solar modules is an eave-ridge direction of a roof.

* * * * *